(12) United States Patent
Esposito

(10) Patent No.: US 11,088,498 B2
(45) Date of Patent: Aug. 10, 2021

(54) UNIVERSAL ISOLATOR ARRANGED FOR REPOSITIONABLE CONNECTION TO A BASE MODULE

(71) Applicant: Eaton Intelligent Power Limited, Dublin (IE)

(72) Inventor: Frederic Vladimir Esposito, Luton (GB)

(73) Assignee: Eaton Intelligent Power Limited, Dublin (IE)

( * ) Notice: Subject to any disclaimer, the term of this patent is extended or adjusted under 35 U.S.C. 154(b) by 278 days.

(21) Appl. No.: 16/079,330

(22) PCT Filed: Jan. 25, 2017

(86) PCT No.: PCT/GB2017/050186
§ 371 (c)(1),
(2) Date: Aug. 23, 2018

(87) PCT Pub. No.: WO2017/144844
PCT Pub. Date: Aug. 31, 2017

(65) Prior Publication Data
US 2019/0052036 A1    Feb. 14, 2019

(30) Foreign Application Priority Data

Feb. 23, 2016 (GB) .................................... 1603111

(51) Int. Cl.
*H01R 29/00* (2006.01)
*H05K 1/02* (2006.01)
(Continued)

(52) U.S. Cl.
CPC .............. *H01R 29/00* (2013.01); *H02H 9/00* (2013.01); *H02H 9/008* (2013.01); *H04L 25/0266* (2013.01); *H05K 1/0295* (2013.01)

(58) Field of Classification Search
CPC .......... H01R 29/00; H01R 27/00; H02H 9/00; H02H 9/008; H05K 1/0295; H04L 25/0266
(Continued)

(56) References Cited

U.S. PATENT DOCUMENTS

| 1,815,233 A | 7/1931 | Burke |
| 4,099,216 A | 7/1978 | Weberg |

(Continued)

FOREIGN PATENT DOCUMENTS

| DE | 19829528 C1 | 2/2000 |
| WO | 99/21332 A1 | 4/1999 |

(Continued)

OTHER PUBLICATIONS

International Search Report for PCT/GB2017/050186, dated May 12, 2017, 2 pages.

(Continued)

*Primary Examiner* — Travis S Chambers
(74) *Attorney, Agent, or Firm* — Stinson LLP

(57) ABSTRACT

The present invention provides for an electronic isolator device such as a universal isolator and having isolation and possible safety functionality and comprising an isolator module (550), and a base module (500), and wherein the isolator module is arranged for removable physical/electrical connection to the base module and in at least two orientations/positions relative to the base module, wherein electrical connection to the base module in each of the at least two orientations/positions serves to configure the type/functionality of the isolator device.

10 Claims, 7 Drawing Sheets

(51) Int. Cl.
*H02H 9/00* (2006.01)
*H04L 25/02* (2006.01)

(58) Field of Classification Search
USPC .......................................... 439/53, 217, 218
See application file for complete search history.

(56) References Cited

U.S. PATENT DOCUMENTS

| | | | | |
|---|---|---|---|---|
| 5,017,818 | A | * | 5/1991 | Dohogne ............... H01R 29/00 310/71 |
| 5,144,517 | A | | 9/1992 | Wieth |
| 5,158,464 | A | | 10/1992 | Landrini |
| 5,564,086 | A | | 10/1996 | Cygan et al. |
| 6,384,350 | B1 | | 5/2002 | Shincovich et al. |
| 6,454,585 | B1 | * | 9/2002 | Homer ................... H01R 27/00 439/151 |
| 2005/0057277 | A1 | | 3/2005 | Chen et al. |
| 2008/0041930 | A1 | | 2/2008 | Smith et al. |
| 2010/0117453 | A1 | | 5/2010 | Langgood et al. |
| 2012/0007736 | A1 | | 1/2012 | Worthington et al. |
| 2015/0229121 | A1 | | 8/2015 | Davidson |
| 2015/0296598 | A1 | | 10/2015 | Haid et al. |
| 2016/0226162 | A1 | | 8/2016 | Emi |
| 2019/0058325 | A1 | * | 2/2019 | Esposito ............ G05B 19/0428 |

FOREIGN PATENT DOCUMENTS

| | | |
|---|---|---|
| WO | 2004010083 A2 | 1/2008 |
| WO | 2014147093 A1 | 9/2014 |
| WO | 2015/066007 A1 | 5/2015 |

OTHER PUBLICATIONS

Paul S. Babiarz, Making Start with the Field Device, Jan. 1, 2005, 20 pages.
Eaton, Surge Protective Devices Introduction, 4 pages, Nov. 1, 2012.
Eaton, Surge Protection Solutions for High Energy Surges and Transient Disturbances Capabilities Overview, 8 pages, Aug. 31, 2016.

* cited by examiner

UNIVERSAL ISOLATOR ARRANGED FOR REPOSITIONABLE CONNECTION TO A BASE MODULE

CROSS-REFERENCE TO RELATED APPLICATIONS

This application is a National Stage Entry of, and claims priority to, PCT Patent Application No. PCT/GB2017/050186, filed Jan. 25, 2017, which claims priority to United Kingdom Patent Application No. GB1603111.4, filed Feb. 23, 2016, both of which are hereby incorporated by reference in their entirety.

The present invention relates to a universal isolator and in one example can relate to a universal isolator for use in relation to devices located in an intrinsically safe environment.

Isolator devices are commonly provided for use often with the safety functionality, such as some form of barrier functionality, so as to provide for the intrinsically safe connectivity for process control functions operating, for example, in relation to hazardous environments.

Traditionally, different isolators are in different configurations, such as Digital Input (DI), Digital Output (DO), Analog Input (AI) and Analog Output (AO) are provided and any one of the different isolators is chosen for particular system requirements.

More recently, and in order to alleviate the need for different isolators, universal isolators have been developed.

For such universal isolators, and since most isolators will have an input, or output, stage on one side, and output, or respectively an input, circuit on the other side, the isolator will duplicate both input and output functionality on both sides. This leads disadvantageously to expensive circuit duplication. Also, some known universal isolators have automatic detection of the signal type, but it is found that such detection is not always achieved correctly.

Additionally some universal isolators or isolating barriers have no direct visual indication of the mode in which they are operating, and this proves particularly problematic during commissioning.

The present invention seeks to provide for a universal isolator having advantages over known such isolators.

According to one aspect of the present invention there is provided an electronic isolator device comprising an isolator module, and a base module, wherein the isolator module is arranged for removable physical/electrical connection to the base module in at least two orientations relative to the base module, wherein electrical connection to the base module in each of the at least two orientations serves to configure the type/functionality of the isolator device.

In confirmation, the isolator module can comprise a universal isolator.

If required, the electronic device is arranged to provide for isolation in relation to devices operating in intrinsically safe environments.

Advantageously, in one arrangement, the number of orientations corresponds to the number of different sides of the isolator module offering connectivity to the base module. Preferably, the isolator device is arranged such that the orientation of physical connection between the isolator module and the base module serves to indicate the type/functionality of the module.

In another arrangement, the isolator functionality can also be achieved with the module being connected in a "shifted" position, without rotation.

Advantageously, the electrical functionality of the isolator device configured by the said at least two orientations comprises at least one of input and/or output functionality.

Merely as an example of the invention, the isolator device can include safety functionality. Such safety functionality can be provided by way of a safety module.

Preferably, the safety functionality can comprise barrier functionality such that the safety module can comprise a barrier module.

The invention proves advantageous through the realisation that, when one of the inputs (or outputs) is not in use on one side of the isolation, it can be used by the other side.

Thus, one side of the isolation will only serve as an input and the other side will only serve as an output and the aforesaid at least two orientations serve, for example, to change the device from an input isolator to an output isolator, and/or for the introduction of intrinsic safety functionality.

The invention is described further hereinafter, by way of example only, with reference to the accompanying drawings, in which.

Figure 1A:
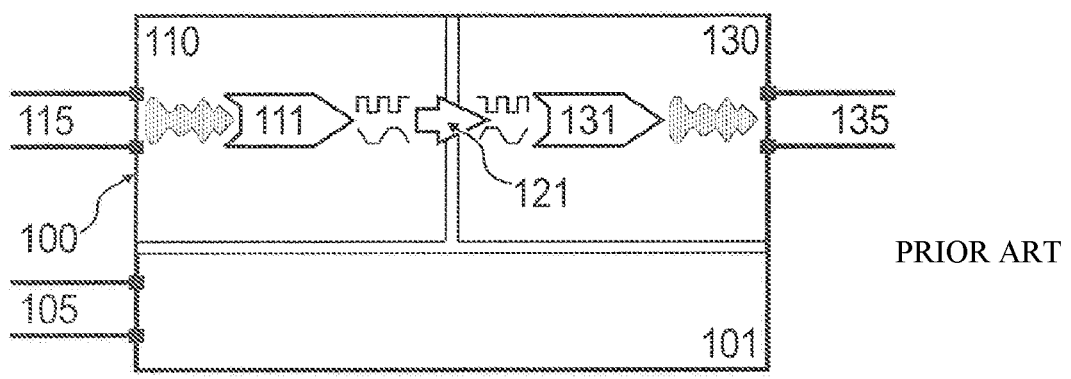
FIG. 1A shows schematically a known isolator arranged for providing an analog output signal.

Turning first to FIG. 1A, there is illustrated a known isolator 100 arranged for delivering an analog output signal and including a supply section 101, a process section 110 and a field section 130.

Analog input process lines 115 are connected to the process section 110 providing analog input signals to a signal processing function 111. The processed signals are then delivered, via an isolation coupling 121, such as an electro-optical coupling, or electro-magnetic coupling, to a signal processing function 131 and the field section 130, and for onward delivery to field lines 135 as an analog output signal.

Figure 1B:
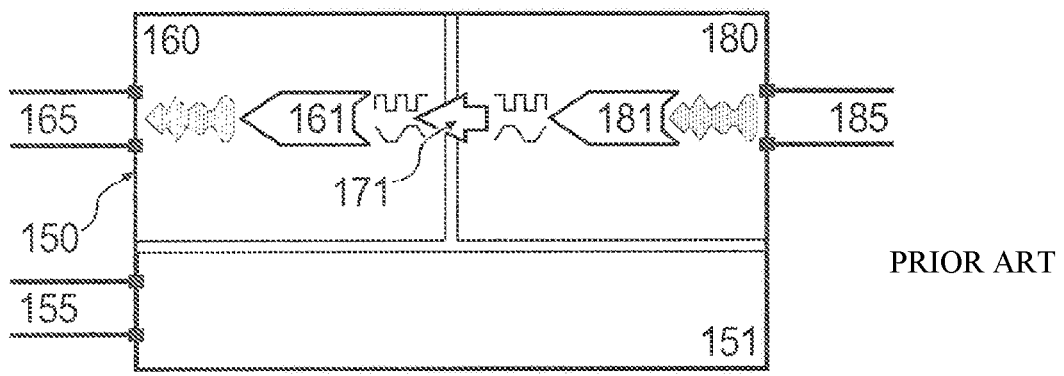
FIG. 1B shows schematically a known isolator arranged for handling an analog input signal.

Should however an opposite direction of input/output current flow be required, then a different isolator 150 such as that of FIG. 1B is employed such that its input signal is provided at field lines 185 for input into the field section 180, and for delivery as an analog signal to an input signal processing function 181, for onward delivery, via an isolator coupling 171, to a signal processing function 161 of a process section 160 to process section output signal lines 165.

Again, the isolator 150 includes a supply section 151 including supply lines 155.

Figure 2A:
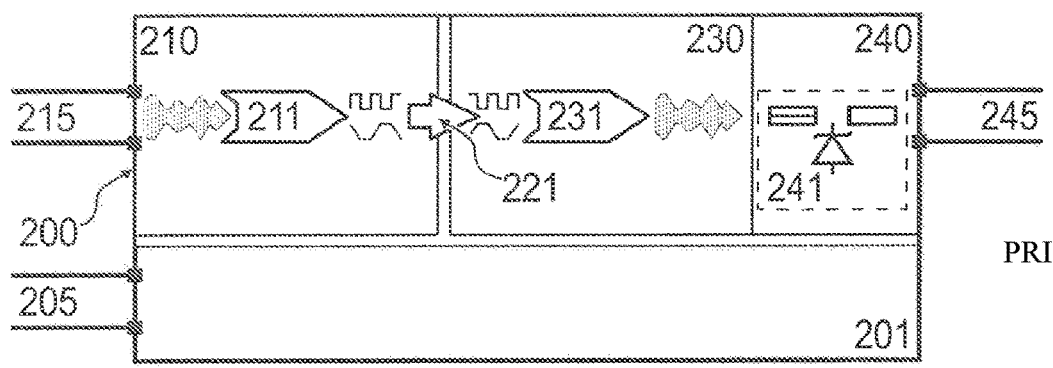
FIG. 2A is a schematic illustration similar to FIG. 1A but including intrinsic safety functionality in the field section.

FIG. 2A illustrates a further variant of known isolators and is similar to the known example of FIG. 1A but also includes intrinsically safe barrier functionality. That is there is illustrated an isolator 200 arranged for delivering an analog output signal and including a supply section 201, a process section 210 and a field section 230, and also an intrinsically safe field section 240 comprising barrier components 241. The analog output at the field side is then available at output field lines 245.

Analog input process lines 215 are connected to the process section 210 for providing analog input signals to a signal processing function 211. The processed signals are then delivered, via an isolation coupling 221, such as an electro-optical coupling, or electro-magnetic coupling, to a signal processing function 231 of the field section 230, and for onward delivery to field lines 245, via the barrier components 241, to the output field lines 245.

As illustrated, the barrier components 241 include a zener and current limit arrangement.

Figure 2B:
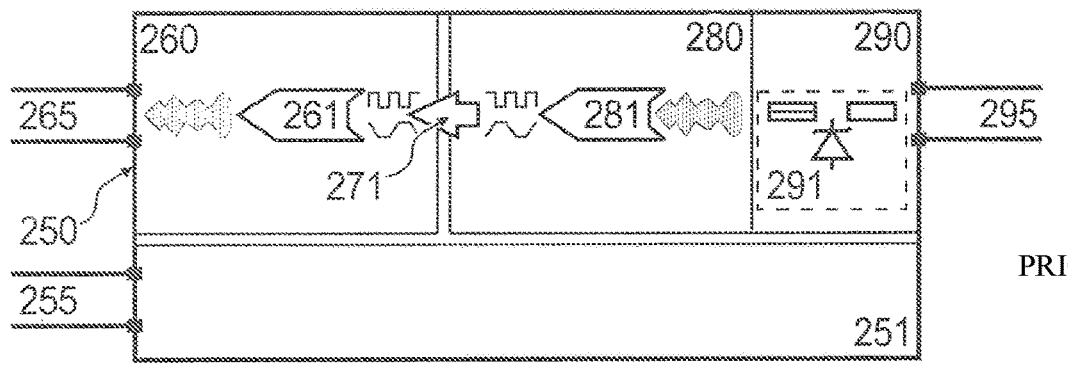
FIG. 2B is a schematic illustration similar to FIG. 1B but including intrinsic safety functionality in the field section.

Again, and should however an opposite direction of input/output current flow be required, but with intrinsic safety functionality, then a different isolator 250 such as that of FIG. 2B is employed such that its input signal is provided at field lines 295 for input into the field section 280, and for delivery as an analog signal to an input signal processing function 281, for onward delivery, via an isolator coupling 271, to a signal processing function 261 of a process section 260 to process section analog output signal lines 265.

As with the known isolator of FIG. 2A, the field section 280 of the isolator 250 of FIG. 2B includes an intrinsically safe field section 290 employing a barrier section 291 connecting to the analog input field lines 295.

Again, the isolator 250 of FIG. 2B includes a supply section 251 associated with supply lines 255.

As will be appreciated, both isolators 200 and 250 would be required to provide for intrinsically safe analog input and output isolation.

However, and in order to avoid the need to achieve the functionality with two different isolators, a known so called universal isolator 300 can be provided such as that illustrated with reference to FIG. 3.

Here, there is again illustrated a supply section 301 supplied by supply lines 305, and wherein multiple analog input/output process lines 315, 316 connect to a process section 310 and multiple input/output analog field lines 335, 336 connect to a field section 330.

As will be appreciated, each of the two sides of the isolation coupling 321 and 322 of the universal isolator 300 include both an input 311, 332 signal processing function and an output 312, 331 signal processing function.

Such known universal isolators can then be configured as required, for example to offer input functionality to, or from, field devices via connections to the field section 330. However, disadvantages and limitations remain insofar as there is duplication of connections in both input and output sides of the isolation, and further insofar as detection of the relevant signal is not always possible.

Figure 3:
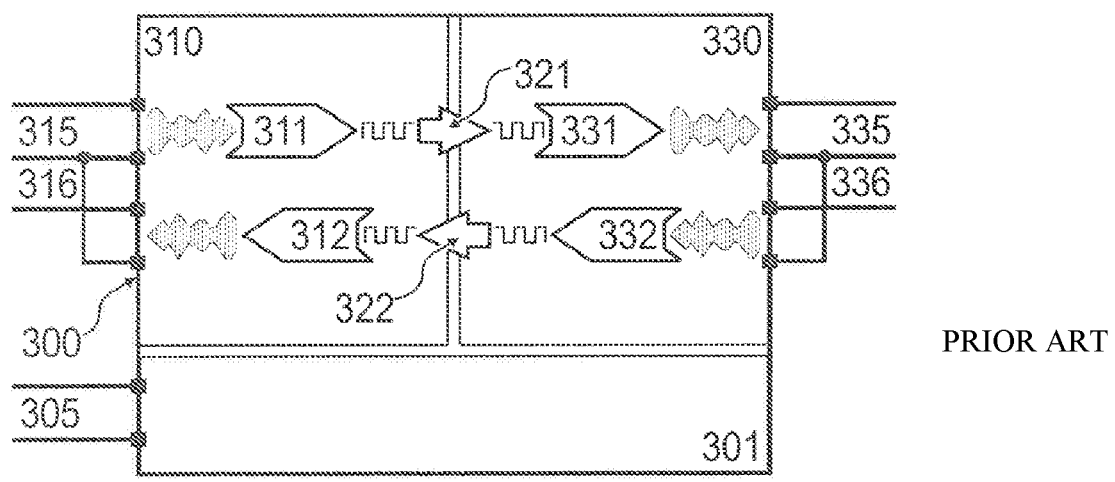
FIG. 3 is a schematic illustration of one example of known universal isolator with both input and output stages on each side.
Figure 4:
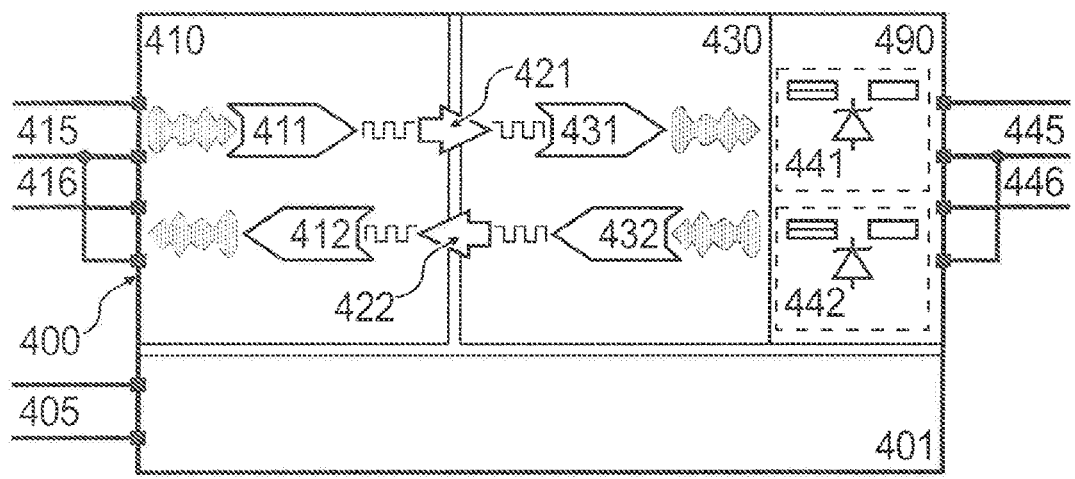
FIG. 4 is a similar schematic illustration to that of FIG. 3 of a universal isolator but employing duplicated intrinsic safety functionality in the field section.

A further variant of the illustrated embodiment of the present invention of FIG. 3 is shown in FIG. 4 and which includes intrinsically safe functionality within the field section. There is again a supply section 401 supplied by supply lines 405, and wherein multiple analog input/output process lines 415, 416 connect to a process section 410 and multiple input/output analog field lines 445, 446 connect to a field section 430.

As will be appreciated, each of the two sides of the isolation coupling 421 and 422 of the universal isolator 400 include both an in 411, 432 signal processing function and an out 412, 431 signal processing function. The additional intrinsically safe functionality of FIG. 4 comprises an intrinsically safe field section 490 employing barrier components 441, 442 associated with each of the plurality of field output/input lines 445, 446.

Figure 5:
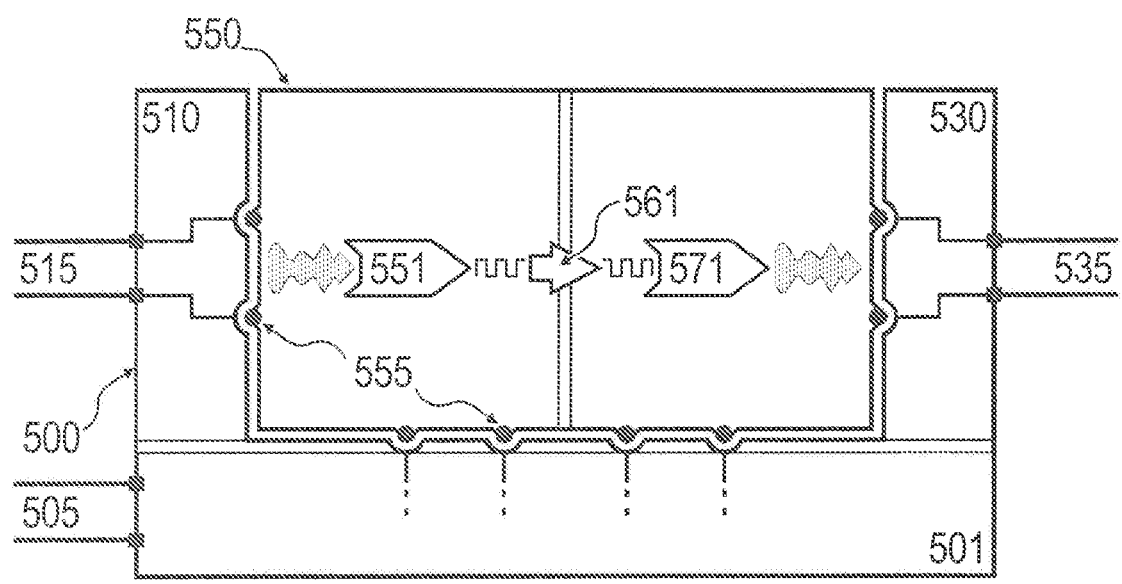
FIG. 5 is a schematic representation of an isolator device according to an embodiment of the present invention.

Turning now however to FIG. 5, there is provided an illustration of a universal isolator device having an isolator base 500 and according to an embodiment of the present invention.

The universal isolator base 500 includes a supply section 501 associated with supply lines 505 and also a process section 510 associated with process lines 515, and a field section 530 associated with field lines 535. Also illustrated is input analog signal processing functionality 551, and output signal processing functionality 571, and with the signals exchanged across an isolation 561.

As an important feature of the present invention, the isolation function within the isolator is provided as a removal section, such as on a removable card 550 having, for example, removably pluggable connectivity 555 between the process and field sections 510, 530 and the supply section 501.

The isolator card 550 including the signal processing 551, 571 and the isolation 561 can therefore be unplugged and removed from the remaining part of the isolator device comprising the process section 510, field section 530 and supply section 501 as required.

The configuration/orientation of the isolator card 550 illustrated in FIG. 5 is that employed, for example for an analog output configuration.

Figure 6:
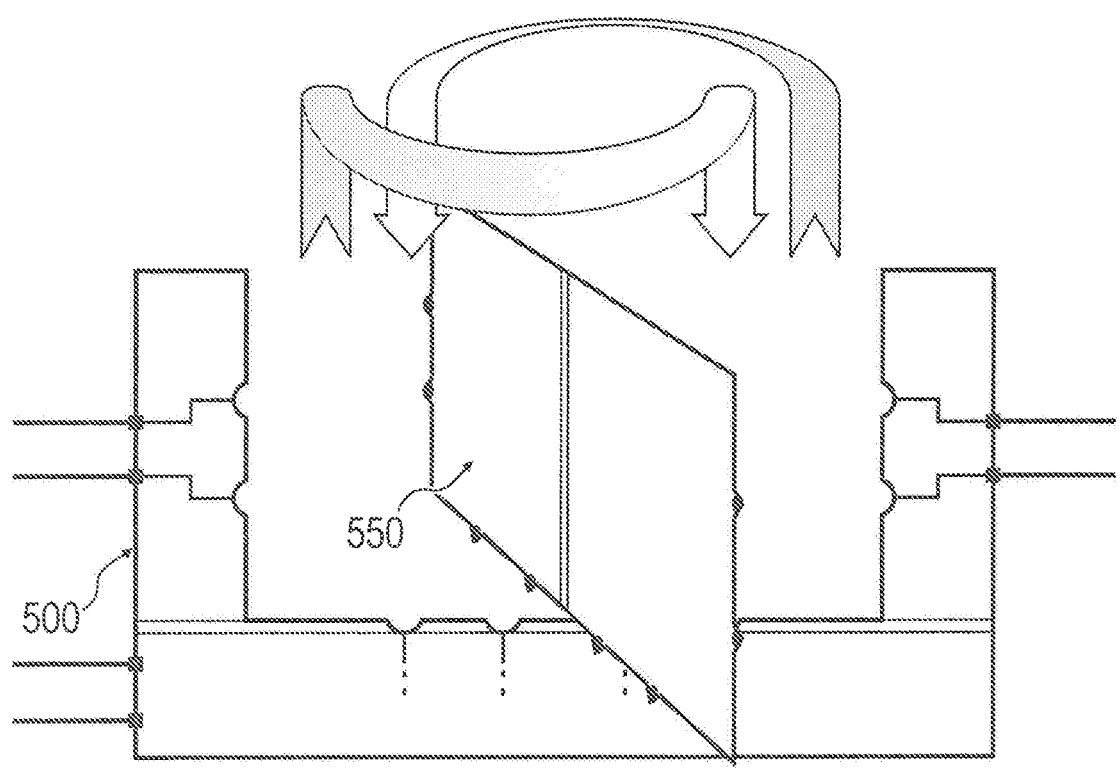
FIG. 6 is an illustration of the manner in which the orientation of an isolator section such as in FIG. 5 can be varied.

However, in this example, through unplugging the isolator card 550 and rotating it through 180 degrees about a vertical axis along with line of the isolation as illustrated by the arrows of FIG. 6, an opposite orientation/configuration can readily be provided so as to alter the input/output configuration. Through such reinsertion with a different orientation, the functionality of the isolator device 500 is altered.

Figure 7:
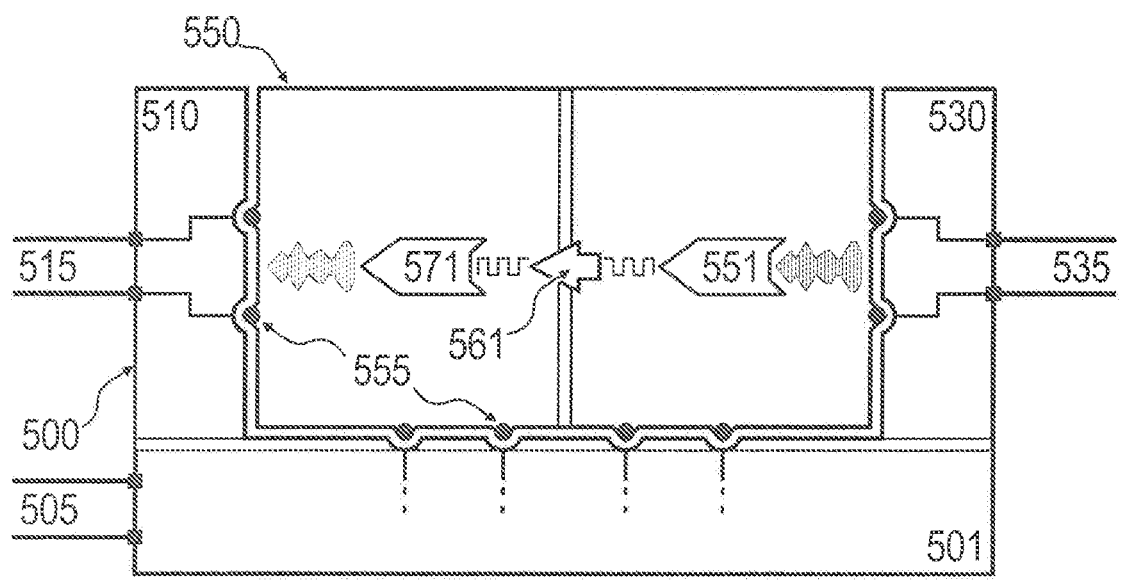
FIG. 7 is a schematic illustration of the isolator device such as of FIG. 5 but with a different orientation between the releasably-connectable isolator section and subsequent to variation such as that of FIG. 6.

FIG. 7 illustrates the universal isolator 500 of FIG. 5 but with the isolator card 550 having been removed, re-orientated and reinserted but in a different configuration/orientation which determines a different type/functionality. Although the device 500 still includes a supply section 501 fed by supply lines 505, and a process-side section 510 connected to process lines 515, and a field-side section 530 connected to field lines 535, the reconnection of the isolator card 550 by way of the connectors 555 and in the manner illustrated in FIG. 7 provides for a configuration in which the field side comprising the field-side connection 530 and field lines 535 function as the input for providing signal processing 551 across an isolation 561, and the process-side connection 510 and process lines 515, serve as an output for signals from signal processing 571 as appearing on the process side of the isolation 561.

Thus, through the separation of the isolator functionality between the process side and field side, and allowing for a reconfigured/re-orientated reconnection thereof, the advantages arising in relation to universal isolator can be achieved without unnecessary additional circuitry nor the potential for misdetection of the signal types.

As will be appreciated, the invention is based on the realisation that when one of the inputs (or outputs) of the universal isolator is not in use on one side, it can effectively be used by the other side. One side of the isolation will only therefore be an input, and the other side will only therefore be an output.

To achieve such selection, the unplugging, and re-plugging, of the electronic isolator card relative to the connection terminals of the remainder of the device allows for change of an input isolator to an output isolator, particularly for Ex safety environment.

Of course, a further rotation perhaps about a different axis, could serve to change digital functions with analog functions. Also, with regard to Ex-i applications, rotating the card before the safety components will overcome the possibility of likely incorrect and dangerous connectivity insofar as a previously connected non-intrinsically safe part cannot then be connected to an intrinsically safe circuit.

This will have the advantage of reducing greatly the number of components and, if needed, number of safety components. Such reduction can advantageously lead to lower cost and will also allow an operative to known exactly how the universal isolator is configured with a particular definite function.

Fewer components are therefore required for the invention and which can enhance reliability. This is an important feature for some field applications, particularly in relation to inaccessible locations.

The invention claimed is:

1. An electronic isolator device comprising:
   an isolator module having an input-side electrical connector connected to an input signal processing functionality of the isolator module and an output side electrical connector connected to an output signal processing functionality of the isolator module, the input signal processing functionality arranged for communication with the output single processing functionality by way of an isolation; and
   a base module having at least two connectors;
   wherein the isolator module is arranged for removable physical/electrical connection to the base module in at least two orientations/positions relative to the base module, with the input-side and output-side connectors arranged to operatively connect to one or the other connector and vice versa at the base module in the at least two orientations/positions; and
   wherein electrical connection to the base module in each of the at least two orientations/positions serves to configure the direction of the communication between the two connectors at the base module and thus the type/functionality of the electronic isolator device.

2. The electronic isolator device of claim 1, in combination with one or more devices, the electronic isolator device arranged to provide for isolation in relation to the devices operating in intrinsically safe environments.

3. The electronic isolator device of claim 1, wherein a number of orientations of the isolator module corresponds to a number of different sides of the isolator module offering connectivity to the base module.

4. The electronic isolator device of claim 1, wherein a number of positions of the isolator module corresponds to a number of different sides of the isolator module offering connectivity to the base module.

5. The electronic isolator device of claim 1, wherein there are at least two potential positions of the isolator module on a common side of the isolator module.

6. The electronic isolator device according to claim 1, wherein the base module includes:
   a supply section associated with supply lines;
   a process section associated with process lines having one of the at least two connector of the base module; and
   a field section associated with field lines having another of the at least two connector of the base module.

7. The electronic isolator device of claim 1, further including a safety functionality.

8. The electronic isolator device of claim 7, wherein the safety functionality is provided by way of a safety module included in the base module.

9. The electronic isolator device of claim 8, wherein the safety module comprises a barrier circuitry.

10. The electronic isolator device of claim 8, wherein the isolator module is arranged such that the orientation/position of physical connection between the isolator module and the safety module serves to visually indicate the type/functionality of the isolator module.

\* \* \* \* \*